United States Patent
Gu et al.

(10) Patent No.: US 10,297,204 B2
(45) Date of Patent: May 21, 2019

(54) SHIFT REGISTER UNIT, DRIVING METHOD, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Honggang Gu, Beijing (CN); Xianjie Shao, Beijing (CN); Qianqian Wang, Beijing (CN); Jie Song, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/539,887

(22) PCT Filed: Nov. 1, 2016

(86) PCT No.: PCT/CN2016/104169
§ 371 (c)(1),
(2) Date: Jun. 26, 2017

(87) PCT Pub. No.: WO2017/181647
PCT Pub. Date: Oct. 26, 2017

(65) Prior Publication Data
US 2018/0204521 A1 Jul. 19, 2018

(30) Foreign Application Priority Data
Apr. 20, 2016 (CN) .......................... 2016 1 0248041

(51) Int. Cl.
*G06F 3/038* (2013.01)
*G09G 5/00* (2006.01)
(Continued)

(52) U.S. Cl.
CPC ........... *G09G 3/3266* (2013.01); *G09G 3/344* (2013.01); *G09G 3/3677* (2013.01); *G11C 19/28* (2013.01);
(Continued)

(58) Field of Classification Search
CPC ..................... G09G 2310/0286; G09G 3/3677
See application file for complete search history.

(56) References Cited

U.S. PATENT DOCUMENTS

2008/0012818 A1* 1/2008 Lee ....................... G09G 3/3677
345/100
2015/0317018 A1 11/2015 Lin et al.
(Continued)

FOREIGN PATENT DOCUMENTS

CN 105047168 A 11/2015
CN 105185343 A 12/2015
(Continued)

OTHER PUBLICATIONS

International Search Report and Written Opinion dated Dec. 29, 2016; PCT/CN2016/104169.
(Continued)

*Primary Examiner* — Nan-Ying Yang
(74) *Attorney, Agent, or Firm* — Ladas & Parry LLP; Loren K. Thompson

(57) ABSTRACT

A shift register unit, a driving method, a gate driving circuit and a display device are provided. The shift register unit includes: a charging module, a reset module, a pull-up module, a first pull-down module, a second pull-down module and a compensation module. In a denoising phase,
(Continued)

the first pull-down module can denoise the pull-up node and the output terminal respectively under the control of a pull-down node, a third power supply signal from a third power supply signal terminal and a switch power supply signal from a switch power supply terminal. Therefore, noises of the pull-up node and the output terminal in the shift register unit are reduced, the output effect of the shift register unit is improved and the problem of noise existing in driving process of the shift register unit is solved.

18 Claims, 7 Drawing Sheets

(51) Int. Cl.
  *G09G 3/3266* (2016.01)
  *G09G 3/34* (2006.01)
  *G09G 3/36* (2006.01)
  *G11C 19/28* (2006.01)
(52) U.S. Cl.
  CPC ............... *G09G 2310/0286* (2013.01); *G09G 2310/061* (2013.01); *G09G 2320/0219* (2013.01); *G09G 2320/04* (2013.01)

(56) References Cited

U.S. PATENT DOCUMENTS

| | | | |
|---|---|---|---|
| 2016/0103510 A1* | 4/2016 | Liu | ................. H03K 17/687 |
| | | | 345/214 |
| 2017/0108989 A1 | 4/2017 | Gu et al. | |
| 2017/0199617 A1 | 7/2017 | Gu et al. | |
| 2017/0221441 A1 | 8/2017 | Gu et al. | |

FOREIGN PATENT DOCUMENTS

| | | |
|---|---|---|
| CN | 105427829 A | 3/2016 |
| CN | 105427830 A | 3/2016 |
| CN | 105513522 A | 4/2016 |
| CN | 105679229 A | 6/2016 |
| CN | 105679262 A | 6/2016 |

OTHER PUBLICATIONS

The First Chinese Office Action dated Jun. 27, 2017; Appln. No. 201610248041.1.

\* cited by examiner

SHIFT REGISTER UNIT, DRIVING METHOD, GATE DRIVING CIRCUIT AND DISPLAY DEVICE

CROSS REFERENCE

The present application claims the priority of a Chinese patent application No. 201610248041.1 filed on Apr. 20, 2016. Herein, the content disclosed by the Chinese patent application is incorporated in full by reference as a part of the present disclosure.

TECHNICAL FIELD

The present disclosure relates to a shift register unit, a driving method, a gate driving circuit and a display device.

BACKGROUND

When a display device displays an image, it needs to utilize a shift register (a gate driving circuit) to scan a pixel unit. The shift register comprises a plurality of shift register units, each of which is corresponding to pixel units of one row. The shift register units realize progressive scanning drive of the pixel units of the display device to display images.

However, with the increasing of the number of pixels, the number of rows to be scanned by the shift register within one frame time increases, which thus requires a smaller layout area of the shift register unit and simpler circuit structure. For example, there exists a known shift register unit, which mainly comprises a buffer module, a pull-up module, a pull-down module, a maintenance module, a charging module and a discharging module. In the known shift register unit, the buffer module is as an input module of the shift register unit, and is configured to input a voltage of an output terminal of a previous row to the shift register unit, the pull-up module is configured to pull up a level of the output terminal to a high level, the pull-down module is configured to pull down the level of the output terminal to a low level, the maintenance module is configured to maintain the level of the output terminal, the charging module is configured to ensure that transistors comprised in the pull-up module are capable of being turned on normally within operation time, and the discharging module is configured to discharge the charging module to turn off the pull-up module.

When the above shift register unit is in a discharging maintenance phase, due to existence of parasitic capacitance of transistors comprised in the pull-up module, a voltage of a pull-up node (i.e., a node connected to gates of the transistors comprised in the pull-up module) is pulled up, such that the transistors comprised in the pull-up module are turned on. In this way, a first clock signal terminal of the shift register unit would re-charge the output terminal. Therefore, in this shift register unit, noise exists in both the pull-up node and the output terminal.

SUMMARY

There are provided in some embodiments of the present disclosure a shift register unit, a driving unit, a gate driving circuit and a display device. According to a first aspect, there is provided a shift register unit, comprising:

a charging module, a reset module, a pull-up module, a first pull-down module, a second pull-down module and a compensation module, the charging module is connected to a first power supply signal terminal, an input signal terminal and a pull-up node respectively, and is configured to charge the pull-up node under the control of an input signal from the input signal terminal;

the reset module is connected to a second power supply signal terminal, a reset signal terminal and the pull-up node respectively, and is configured to reset the pull-up node under the control of a reset signal from the reset signal terminal;

the pull-up module is connected to a clock signal terminal, the pull-up node, a pull-down node and an output terminal respectively, and is configured to output a driving signal to the output terminal under the control of the pull-up node and the pull-down node;

the first pull-down module is connected to the pull-down node, the pull-up node, a third power supply signal terminal, a switch power supply terminal and the output terminal respectively, and is configured to denoise the pull-up node and the output terminal under the control of the pull-down node, a third power supply signal form the third power supply signal terminal and a switch power supply signal from the switch power supply terminal;

the second pull-down module is connected to the pull-up node, the pull-down node and the third power supply signal terminal respectively, and is configured to pull down a potential of the pull-down node under the control of the pull-up node;

the compensation module is connected to the pull-up node, the pull-down node, the third power supply signal terminal and the switch power supply terminal respectively, and is configured to compensate for a potential of the pull-up node under the control of the pull-down node and the switch power supply signal from the switch power supply terminal.

Optionally, when forward scanning is performed, the charging module comprises a first transistor; the reset module comprises a second transistor;

a first electrode of the first transistor is connected to the first power supply signal terminal, a second electrode of the first transistor is connected to the pull-up node, and a gate of the first transistor is connected to the input signal terminal; and a first electrode of the second transistor is connected to the second power supply signal terminal, a second electrode of the second transistor is connected to the pull-up node, and a gate of the second transistor is connected to the reset signal terminal.

Optionally, when backward scanning is performed, the charging module comprises the second transistor; the reset module comprises the first transistor;

the first electrode of the second transistor is connected to the first power supply signal terminal, the second electrode of the second transistor is connected to the pull-up node, and the gate of the second transistor is connected to the input signal terminal; and the first electrode of the first transistor is connected to the second power supply signal terminal, the second electrode of the first transistor is connected to the pull-up node, and the gate of the first transistor is connected to the reset signal terminal.

Optionally, the pull-up module comprises a third transistor, a first capacitor and a second capacitor;

a first electrode of the third transistor is connected to the clock signal terminal, a second electrode of the third transistor is connected to the output terminal, and a gate of the third transistor is connected to the pull-up node;

one terminal of the first capacitor is connected to the pull-up node, and the other terminal of the first capacitor is connected to the output terminal; and one terminal of the second capacitor is connected to the clock signal terminal, and the other terminal the second capacitor is connected to the pull-down node.

Optionally, the first pull-down module comprises: a fourth transistor, a fifth transistor and a sixth transistor;

a first electrode of the fourth transistor is connected to the third power supply signal terminal, a second electrode of the fourth transistor is connected to the output terminal, and a gate of the fourth transistor is connected to the switch power supply terminal;

a first electrode of the fifth transistor is connected to the third power supply signal terminal, a second electrode of the fifth transistor is connected to the output terminal, and a gate of the fifth transistor is connected to the pull-down node; and a first electrode of the sixth transistor is connected to the third power supply signal terminal, a second electrode of the sixth transistor is connected to the pull-up node, and a gate of the sixth transistor is connected to the pull-down node.

Optionally, the second pull-down module comprises: a seventh transistor; and a first electrode of the seventh transistor is connected to the third power supply signal terminal, a second electrode of the seventh transistor is connected to the pull-down node, and a gate of the seventh transistor is connected to the pull-up node.

Optionally, the compensation module comprises: an eighth transistor, a ninth transistor and a tenth transistor;

a first electrode of the eighth transistor is connected to the third power supply signal terminal, a second electrode of the eighth transistor is connected to a gate of the tenth transistor, and a gate of the eighth transistor is connected to the pull-down node;

a first electrode of the ninth transistor is connected to the switch power supply terminal, a second electrode of the ninth transistor is connected to the gate of the tenth transistor, and a gate of the ninth transistor is connected to the pull-up node; and a first electrode of the tenth transistor is connected to the switch power supply terminal, a second electrode of the tenth transistor is connected to the pull-up node, and the gate of the tenth transistor is connected to the second electrode of the eighth transistor and the second electrode of the ninth transistor.

Optionally, the transistors are N type transistors.

According to a second aspect, there is provided a driving method of a shift register unit which comprises: a charging module, a reset module, a pull-up module, a first pull-down module, a second pull-down module and a compensation module, the driving method comprising:

in a charging phase, inputting a first power supply signal via a first power supply signal terminal, inputting an input signal via an input signal terminal, inputting a clock signal via a clock signal terminal, and outputting the first power supply signal to a pull-up node by the charging module under the control of the input signal;

in an output phase, inputting a switch power supply signal via a switch power supply terminal, inputting the input signal via the input signal terminal, inputting the clock signal via the clock signal terminal, making the pull-up node maintain a potential of the first power supply signal, and outputting the clock signal to the output terminal by the pull-up module under the control of the pull-up node;

in a reset phase, inputting a reset signal via a reset signal terminal, inputting a second power supply signal via a second power supply signal terminal, and outputting the second power supply signal to the pull-up node by the reset module under the control of the reset signal; and in a denoising phase, inputting a third power supply signal via a third power supply signal terminal, inputting the clock signal via the clock signal terminal, making the pull-up node maintain a potential of the second power supply signal, pulling up a potential of the pull-up node by the pull-up module under the control of the clock signal, and outputting the third power supply signal to the pull-up node and the output terminal respectively by the first pull-down module under the control of the pull-down node.

Optionally, when a touch control signal is received, after the denoising phase, the method further comprises:

in a vertical blanking phase: the switch power supply signal input by the switch power supply terminal being a first potential, outputting the third power supply signal to the output terminal by the first pull-down module under the control of the switch power supply signal, and the third power supply signal being a second potential.

Optionally, when a touch control signal is received, between the output phase and the reset phase, the method further comprises:

in a horizontal blanking phase: the switch power supply signal input by the switch power supply terminal being the first potential, outputting the third power supply signal to the output terminal by the first pull-down module under the control of the switch power supply signal, the third power supply signal being the second potential, making the pull-up node maintain the first potential, and outputting the switch power supply signal to the pull-up node by the compensation module under the control of the pull-up node.

Optionally, when forward scanning is performed, the charging module comprises: a first transistor; the reset module comprises a second transistor; the pull-up module comprises: a third transistor, a first capacitor and a second capacitor; the first pull-down module comprises: a fourth transistor, a fifth transistor and a sixth transistor; the second pull-down module comprises: a seventh transistor; the compensation module comprises: an eighth transistor, a ninth transistor and a tenth transistor.

In the charging phase, the input signal input by the input signal terminal is the first potential, the first transistor is turned on, the first power supply signal terminal provides the first power supply signal to the pull-up node, and the first power supply signal is the first potential.

In the output phase, the pull-up node maintains the first potential, the third transistor, the seventh transistor and the ninth transistor are turned on, the clock signal terminal provides the clock signal to the output terminal, the third power supply signal terminal provides the third power supply signal to the pull-down node, the switch power supply signal terminal provides the switch power supply signal to a gate of the tenth transistor, the third power supply signal is the second potential, the fifth transistor, the sixth transistor and the eighth transistor are turned off, the switch power supply signal is the second potential, and the tenth transistor and the fourth transistor are turned off.

In the reset phase, the reset signal input by the reset signal terminal is the first potential, the second transistor is turned on, the second power supply signal terminal provides the second power supply signal to the pull-up node, and the second power supply signal is the second potential.

In the denoising phase, the clock signal input by the clock signal terminal is the first potential, the second capacitor pulls up the potential of the pull-down node to the first potential, the sixth transistor, the fifth transistor and the eighth transistor are turned on, the third power supply signal terminal provides the third power supply signal to the pull-up node, the output terminal and the gate of the tenth transistor respectively, the third power supply signal is the second potential, and the tenth transistor is turned off.

Optionally, when backward scanning is performed, the charging module comprises: the second transistor; the reset module comprises: the first transistor; the pull-up module comprises: the third transistor, the first capacitor and the second capacitor; the first pull-down module comprises: the fourth transistor, the fifth transistor and the sixth transistor; the second pull-down module comprises: the seventh transistor; the compensation module comprises: the eighth transistor, the ninth transistor and the tenth transistor.

In the charging phase, the input signal input by the input signal terminal is the first potential, the second transistor is turned on, the first power supply signal terminal outputs the first power supply signal to the pull-up node, and the first power supply signal is the first potential.

In the output phase, the pull-up node maintains the first potential, the third transistor, the seventh transistor and the ninth transistor are turned on, the clock signal terminal provides the clock signal to the output terminal, the third power supply signal terminal outputs the third power supply signal to the pull-down node, the switch power supply signal terminal inputs the switch power supply signal to the gate of the tenth transistor, the third power supply signal is the second potential, the fifth transistor, the sixth transistor and the eighth transistor are turned off, the switch power supply signal is the second potential, and the tenth transistor and the fourth transistor are turned off.

In the reset phase, the reset signal input by the reset signal terminal is the first potential, the first transistor is turned on, the second power supply signal terminal provides the second power supply signal to the pull-up node, and the second power supply signal is the second potential.

In the denoising phase, the clock signal input by the clock signal terminal is the first potential, the second capacitor pulls up the potential of the pull-down node to the first potential, the sixth transistor, the fifth transistor and the eighth transistor are turned on. The third power supply signal terminal provides the third power supply signal to the pull-up node, the output terminal and the gate of the tenth transistor respectively, and the third power supply signal is the second potential, such that the tenth transistor is turned off.

Optionally, the first pull-down module comprises: the fourth transistor, the fifth transistor and the sixth transistor.

In the vertical blanking phase, the switch power supply signal input by the switch power supply terminal is the first potential, the fourth transistor is turned on, the third power supply signal terminal provides the third power supply signal to the output terminal, and the third power supply signal is the second potential.

Optionally, the first pull-down module comprises: the fourth transistor, the fifth transistor and the sixth transistor; the compensation module: the eighth transistor, the ninth transistor and the tenth transistor.

In the horizontal blanking phase, the switch power supply signal input by the switch power supply terminal is the first potential, the pull-up node maintains the first potential, the fourth transistor, the ninth transistor and the tenth transistor are turned on, the third power supply signal terminal provides the third power supply signal to the output terminal, and the switch power supply terminal outputs the switch power supply signal to the pull-up node.

Optionally, the transistors can be N type transistors, and the first potential is a high potential relative to the second potential.

According to a third aspect, there is provided a gate driving circuit, comprising at least two shift register units as described in the first aspect connected in cascades.

According to a fourth aspect, there is provided a display device, comprising the gate driving circuit as described in the third aspect.

There are provided in the embodiments of the present disclosure a shift register unit, a driving method, a gate driving circuit and a display device. The shift register unit comprises: the charging module, the reset module, the pull-up module, the first pull-down module, the second pull-down module and the compensation module. In the denoising phase, the first pull-down module is capable of denoising the pull-up node and the output terminal respectively under the control of the pull-down node, the third power supply signal from the third power supply signal terminal and the switch power supply signal from the switch power supply terminal. Therefore, noises of the pull-up node and the output terminal in the shift register unit are reduced, and the output effect of the shift register unit is improved.

DETAILED DESCRIPTION

In order to make solutions and advantages of the present disclosure more clear, embodiments of the present disclosure will be further described below in detail by combining with accompanying figures. Obviously, following descriptions are just some embodiments of the present disclosure. For those ordinary skilled in the art, other embodiments can be obtained according to these embodiments without paying any inventive labor.

Transistors adopted in all the embodiments of the present disclosure are thin film transistors or field effect transistors or other devices having the same characteristics. According to functions in a circuit, the transistors adopted in the embodiments of the present disclosure are mainly switch transistors. Since sources and drains of the switch transistors adopted herein are symmetrical, the sources and drains thereof can be exchanged with each other. In the embodiment of the present disclosure, in order to distinct two electrode other than gates of the transistors, a source thereof is referred to as a first electrode, and a drain thereof is referred to a second electrode. Therefore, the gate of the transistor can also be referred to as a third electrode. According to forms in the figures, it is prescribed that a middle terminal of the transistor is a gate, a signal input terminal of the transistor is a source, and a signal output terminal of the transistor is a drain. The switch transistors adopted in the embodiments of the present disclosure are N type switch transistors. The N type switch transistor is turned on when the gate is at a high potential and turned off when the gate is at a low potential. In the embodiments of the present disclosure, the first potential is the high potential, and the second potential is the second potential. In addition, a plurality of signals in the embodiments of the present disclosure are corresponding to the first potential and the second potential. The first potential and the second potential only represent that the potential of the signal has two states, but not represents that the first potential or the second potential in the text has a specific numeric value.

Figure 1:
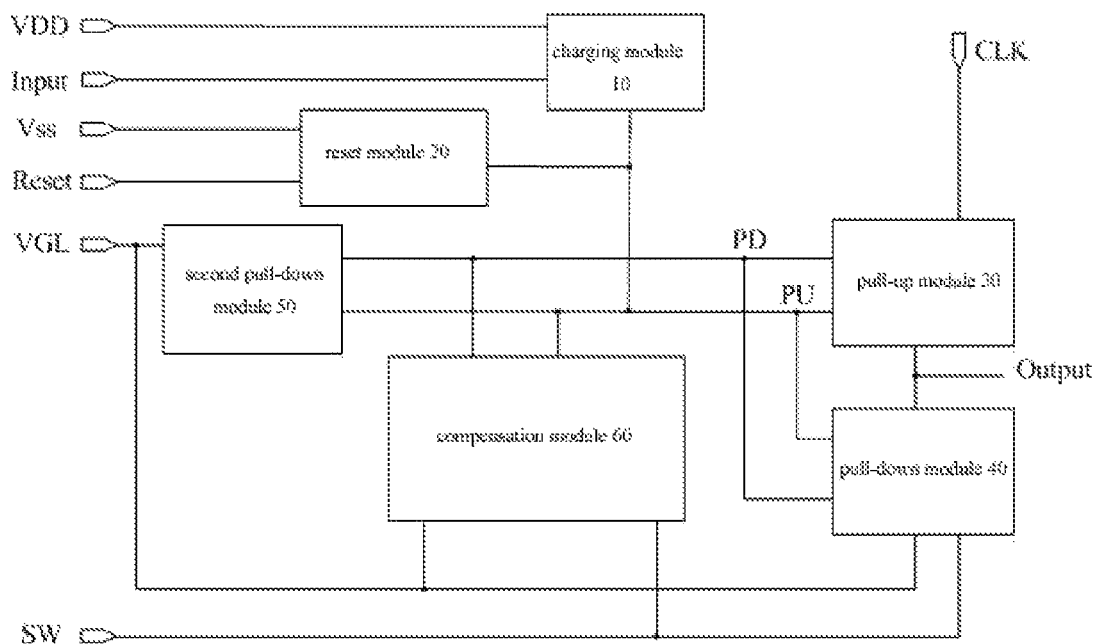
FIG. 1 is a structure schematic diagram of a shift register unit provided in an embodiment of the present disclosure.

FIG. 1 is a structure schematic diagram of a shift register unit provided in an embodiment of the present disclosure. Referring to FIG. 1, the shift register unit comprises:

a charging module 10, a reset module 20, a pull-up module 30, a first pull-down module 40, a second pull-down module 50 and a compensation module 60.

The charging module 10 is connected to a first power supply signal terminal VDD, an input signal terminal Input and a pull-up node PU respectively, and is configured to charge the pull-up node PU under the control of an input signal from the input signal terminal Input.

The reset module 20 is connected to a second power supply signal terminal Vss, a reset signal terminal Reset and the pull-up node PU respectively, and is configured to reset the pull-up node PU under the control of a reset signal from a reset signal terminal Reset.

The pull-up module 30 is connected to a clock signal terminal CLK, a pull-up node PU, a pull-down PU and an output terminal Output respectively, and is configured to output a driving signal to the output terminal Output under the control of the pull-up node PU and the pull-down node PD, and the driving signal is a clock signal from the clock signal terminal CLK.

The first pull-down module 40 is connected to the pull-down node PD, the pull-up node PU, a third power supply signal terminal VGL, a switch power supply terminal SW and the output terminal Output respectively, and is configured to denoise the pull-up node PU and the output terminal Output respectively under the control of the pull-down node PD, a third power supply signal from the third power supply signal terminal VGL and a switch power supply signal from the switch power supply terminal SW.

The second pull-down module 50 is connected to the pull-up node PU, the pull-down node PD and the third power supply signal terminal VGL respectively, and is configured to pull down a potential of the pull-down node PD under the control of the pull-up node PU.

The compensation module 60 is connected to the pull-up node PU, the pull-down node PD, the third power supply signal terminal VGL, and the switch power supply terminal SW respectively, and is configured to compensate for a potential of the pull-up node PU under the control of the pull-down node PD and the switch power supply signal from the switch power supply terminal SW.

To sum up, there is provided in the embodiment of the present disclosure a shift register unit, comprising: the charging module, the reset module, the pull-up module, the first pull-down module, the second pull-down module and the compensation module. In the denoising phase, the first pull-down module is capable of denoising the pull-up node and the output terminal respectively under the control of the pull-down node, the third power supply signal from the third power supply signal terminal and the switch power supply signal from the switch power supply terminal SW. Therefore, noises of the pull-up node and the output terminal in the shift register unit are reduced, and the output effect of the shift register unit is improved.

Figure 2:
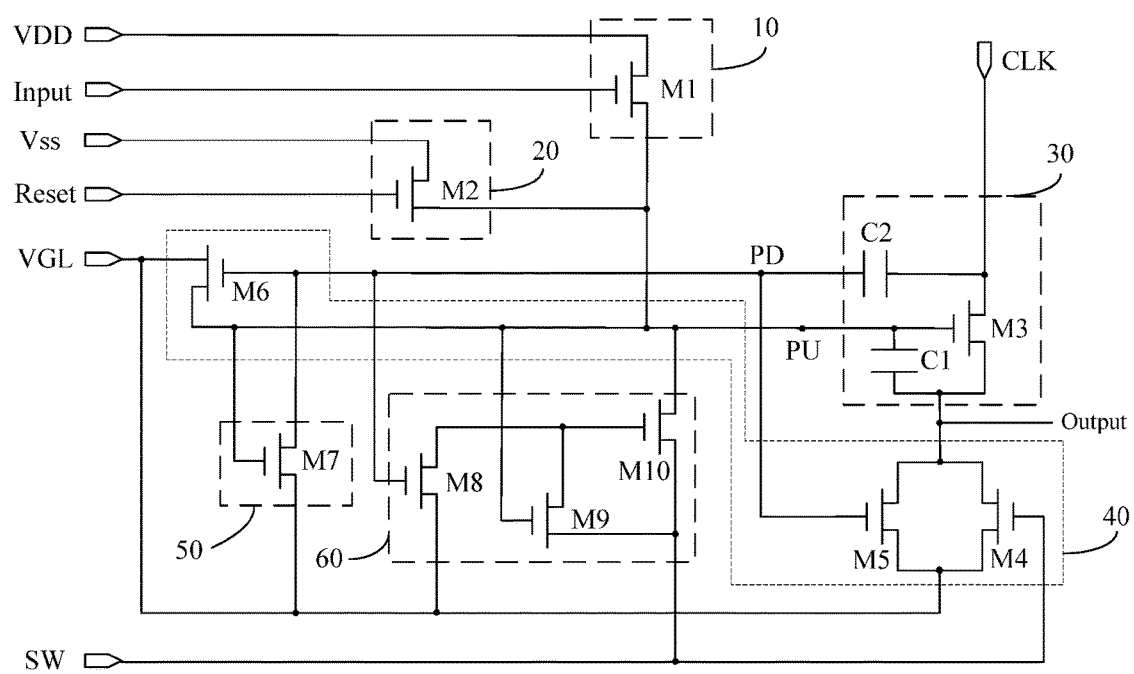
FIG. 2 is a structure schematic diagram of another shift register unit provided in an embodiment of the present disclosure.

Further, please referring to FIG. 2, it is a structure schematic diagram of another shift register unit provided in an embodiment of the present disclosure. The shift register unit is added with exemplary respective elements on the basis of the shift register unit as shown in FIG. 1, so that the shift register unit provided in the embodiments of the present disclosure has better performance. As shown in FIG. 2, when forward scanning is performed, the charging module 10 can comprise: a first transistor M1; the reset module 20 can comprise: a second transistor M2.

As shown in FIG. 2, a first electrode of the first transistor M1 is connected to the first power supply signal terminal VDD, a second electrode of the first transistor M1 is connected to the pull-up node PU, and a gate of the first transistor M1 is connected to the input signal terminal Input. The first transistor M1 is capable of outputting the first power supply signal from the first power supply signal terminal VDD to the pull-up node PU under the control of the input signal form the input signal terminal Input, the first power supply signal is a first potential, and the first potential is a high potential, so that charging of the pull-up node PU can be realized.

A first electrode of the second transistor M2 is connected to the second power supply signal terminal Vss, a second electrode of the second transistor M2 is connected to the pull-up node PU, and a gate of the second transistor M2 is connected to the reset signal terminal Reset. The second transistor M2 is capable of outputting the second power supply signal from the second power supply signal terminal Vss to the pull-up node PU under the control of the reset signal from the reset signal terminal Reset, the second power supply signal is a second potential, and the second potential is a low potential relative to the first potential, so that resetting of the pull-up node PU can be realized.

Figure 3:
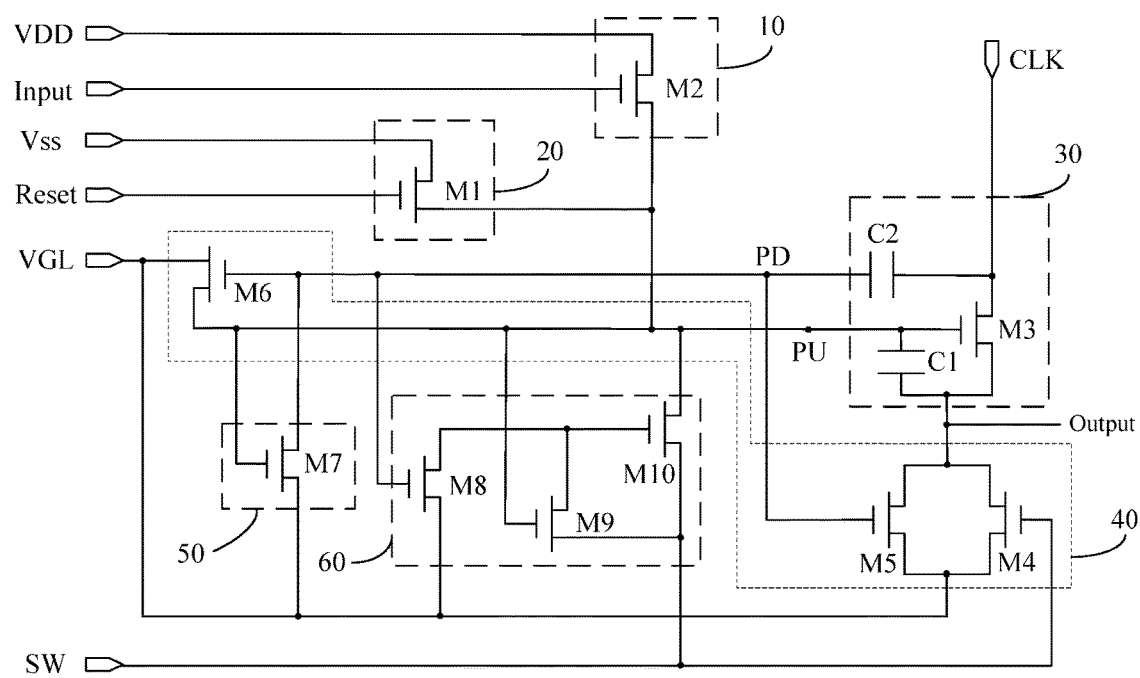
FIG. 3 is a structure schematic diagram of another shift register unit provided in an embodiment of the present disclosure.

Optionally, FIG. 3 is a structure schematic diagram of another shift register unit provided in an embodiment of the present disclosure. As shown in FIG. 3, when backward scanning is performed, the charging module 10 can comprise: the second transistor M2; the reset module 20 can comprise: the first transistor M1.

A first electrode of the second transistor M2 is connected to the first power supply signal terminal VDD, a second electrode of the second transistor M2 is connected to the pull-up node PU, and a gate of the second transistor M2 is connected to the input signal terminal Input; a first electrode of the first transistor M1 is connected to the second power supply signal terminal Vss, a second electrode thereof is connected to the pull-up node PU, and a gate thereof is connected to the reset signal terminal Reset.

Optionally, as shown in FIGS. 2 and 3, the pull-up module 30 can comprise: a third transistor M3, a first capacitor C1 and a second capacitor C2.

A first electrode of the third transistor M3 is connected to a clock signal terminal CLK, a second electrode of the third transistor M3 is connected to the output terminal Output, and a gate of the third transistor M3 is connected to the pull-up node PU. The third transistor M3 is capable of outputting the clock signal from the clock signal terminal CLK to the output terminal Output under the control of the pull-up node PU.

One terminal of the first capacitor C1 is connected to the pull-up node PU, and the other terminal of the first capacitor C1 is connected to the output terminal Output.

One terminal of the second capacitor C2 is connected to the clock signal terminal CLK, and the other terminal of the second capacitor C2 is connected to the pull-down node PD.

Optionally, referring to FIG. 2, the first pull-down module 40 can comprise: a fourth transistor M4, a fifth transistor M5 and a sixth transistor M6.

A first electrode of the fourth transistor M4 is connected to the third power supply signal terminal VGL, a second electrode of the fourth transistor M4 is connected to the output terminal Output, and a gate of the fourth transistor M4 is connected to the switch power supply terminal SW. The fourth transistor M4 is capable of outputting the third power supply signal form the third power supply signal terminal VGL to the output terminal Output under the control of the switch power supply signal of the switch power supply terminal SW, the third power supply signal is the second potential, and the second potential is a low potential relative to the first potential, so that denoising of the output terminal Output can be realized.

A first electrode of the fifth transistor M5 is connected to the third power supply signal terminal VGL, a second electrode of the fifth transistor M5 is connected to the output terminal Output, and a gate of the fifth transistor M5 is connected to the pull-down node PD. The fifth transistor M5 is capable of outputting the third power supply signal from the third power supply signal terminal VGL to the output terminal Output under the control of the pull-down node PD, and the third power supply signal is the second potential, so that denoising of the output terminal Output can be realized.

A first electrode of the sixth transistor M6 is connected to the third power supply signal terminal VGL, a second electrode of the sixth transistor M6 is connected to the pull-up node PU, and a gate of the sixth transistor M6 is connected to the pull-down node PD. The sixth transistor M6 is capable of outputting the third power supply signal from the third power supply signal terminal VGL to the pull-up node PU under the control of the pull-down node PD, and the third power supply signal is the second potential, so that denoising of the pull-up node PU can be realized.

Optionally, referring to FIG. 2, the second pull-down module 50 can comprise: a seventh transistor M7.

A first electrode of the seventh transistor M7 is connected to the third power supply signal terminal VGL, a second electrode of the seventh transistor M7 is connected to the pull-down node PD, and a gate of the seventh transistor M7 is connected to the pull-up node PU. The seventh transistor M7 is capable of outputting the third power supply signal from the third power supply signal terminal VGL to the pull-down node PD under the control of the pull-up node PU, and the third power supply signal is the second potential, so that the potential of the pull-down node PD is pulled down.

Optionally, referring to FIG. 2, the compensation module 60 can comprise: an eighth transistor M8, a ninth transistor M9 and a tenth transistor M10.

A first electrode of the eighth transistor M8 is connected to the third power supply signal terminal VGL, and a second electrode of the eighth transistor M8 is connected to a gate of the tenth transistor M10, and a gate of the eighth transistor M8 is connected to the pull-down node PD.

A first electrode of the ninth transistor M9 is connected to the switch power supply terminal SW, a second electrode of the ninth transistor M9 is connected to the gate of the tenth transistor M10, and a gate of the ninth transistor M9 is connected to the pull-up node PU.

A first electrode of the tenth transistor M10 is connected to the switch power supply terminal SW, a second electrode of the tenth transistor M10 is connected to the pull-up node PU, and the gate of the tenth transistor M10 is connected to the second electrode of the eighth transistor M8 and the second electrode of the ninth transistor M9 respectively. The tenth transistor M10 is capable of outputting the switch power supply signal from the switch power supply terminal SW to the pull-up node PU under the control of the second electrode of the eighth transistor M8 and the ninth transistor M9, and is capable of compensating for the potential of the pull-up node PU when the switch power supply signal is the first potential.

Optionally, the first to tenth transistors can be N type transistors, and a first electrode of each transistor is a source, and a second electrode of each transistor is a drain.

To sum up, there are provided in the embodiment of the present disclosure the shift register unit, comprising: the charging module, the reset module, the pull-up module, the first pull-down module, the second pull-down module and the compensation module. In the denoising phase, the first pull-down module is capable of denoising the pull-up node and the output terminal respectively under the control of the pull-down node, the third power supply signal from the third power supply signal terminal, and the switch power supply signal from the switch power supply terminal. Therefore, the noises of the pull-up node and the output terminal in the shift register unit are reduced, and the output effect of the shift register unit is improved. Furthermore, less number of transistors are used in the shift register unit, which is helpful to realize the narrow-frame design of the display device, so that the cost of the display device is reduced.

Figure 4:
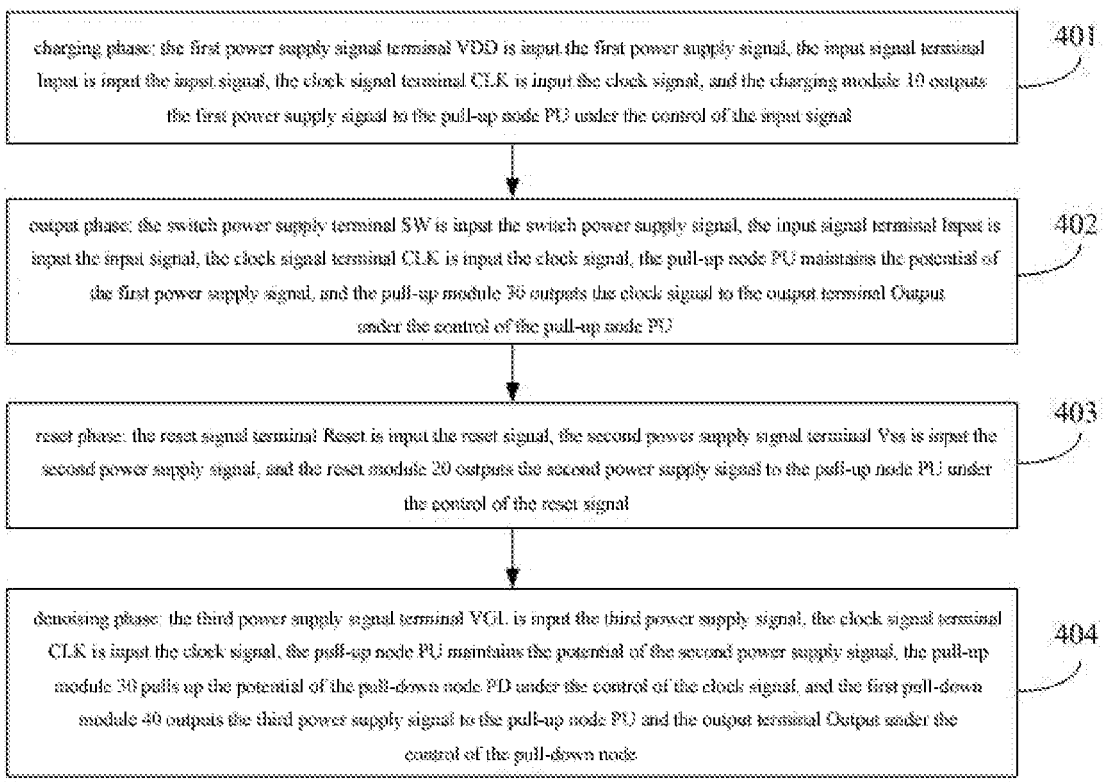
FIG. 4 is a flow diagram of a driving method of a shift register unit provided in an embodiment of the present disclosure.

FIG. 4 is a flow diagram of a driving method of a shift register unit provided in an embodiment of the present disclosure. The structure of the shift register unit can be as shown in FIG. 1. The shift register unit comprises: a charging module 10, a reset module 20, a pull-up module 30, a first pull-down module 40, a second pull-down module 50 and a compensation module 60.

Referring to FIG. 4, the driving method comprises following operation processes:

In step 401 (charging phase), the first power supply signal terminal VDD is input the first power supply signal, the input signal terminal Input is input the input signal, the clock signal terminal CLK is input the clock signal, and the charging module 10 outputs the first power supply signal to the pull-up node PU under the control of the input signal.

In step 402 (output phase), the switch power supply terminal SW is input the switch power supply signal, the input signal terminal Input is input the input signal, the clock signal terminal CLK is input the clock signal, the pull-up node PU maintains the potential of the first power supply signal, and the pull-up module 30 outputs the clock signal to the output terminal Output under the control of the pull-up node PU.

In step 403 (reset phase), the reset signal terminal Reset is input the reset signal, the second power supply signal terminal Vss is input the second power supply signal, and the reset module 20 outputs the second power supply signal to the pull-up node PU under the control of the reset signal.

In step 404 (denoising phase), the third power supply signal terminal VGL is input the third power supply signal, the clock signal terminal CLK is input the clock signal, the pull-up node PU maintains the potential of the second power supply signal, the pull-up module 30 pulls up the potential of the pull-down node PD under the control of the clock signal, and the first pull-down module 40 outputs the third power supply signal to the pull-up node PU and the output terminal Output under the control of the pull-down node.

To sum up, there is provided in the embodiment of the present disclosure the driving method of the shift register unit. The driving method mainly comprises the charging phase, the output phase, the reset phase and the denoising phase. In the denoising phase, the first pull-down module is capable of denoising the pull-up node and the output terminal respectively under the control of the pull-down node, the third power supply signal from the third power supply signal terminal and the switch power supply signal from the switch power supply terminal. Therefore, the noises of the pull-up node and the output terminal in the shift register are reduced, and the output effect of the shift register unit is improved.

Optionally, in the process of driving the shift register unit through the driving method, when the touch control signal is received, after the denoising phase, the method can further comprise:

in a vertical blanking phase, the switch power signal input by the switch power supply terminal SW is a first potential, the first potential is a high potential, the first pull-down module 40 is capable of outputting a third power supply signal to the output terminal Output under the control of the switch power supply signal, the third power supply signal is a second potential, and the second potential is a low potential relative to the first potential. Since the signal output by the output terminal Output is a low potential, interference on the touch control signal can be prevented.

Optionally, in the process of driving the shift register unit though the driving method, when the touch control signal is received, between the output phase and the reset phase, the method can further comprise:

in a horizontal blanking phase, the switch power supply signal input by the switch power supply terminal SW is the first potential, the first potential is the high potential, the first pull-down module 40 can output the third power supply signal to the output terminal under the control of the switch power supply signal, the pull-up node PU maintains the first potential, and the compensation module 60 can output the switch power supply signal to the pull-up node PU under the control of the pull-up node. Since the switch power supply signal is the first potential, compensation for the potential of the pull-up node PU can be realized.

Optionally, returning to FIG. 2, when forward scanning is performed, the charging module 10 comprises: the first transistor M1; the reset module 20 comprises: the second transistor M2; the pull-up module 30 comprises: the third transistor M3, the first capacitor C1 and the second capacitor C2; the first pull-down module 40 comprises: the fourth transistor M4, the fifth transistor M5, and the sixth transistor M6; the second pull-down module 50 comprises: the seventh transistor M7; the compensation module 60 comprises the eighth transistor M8, the ninth transistor M9 and the tenth transistor M10.

Figure 5:
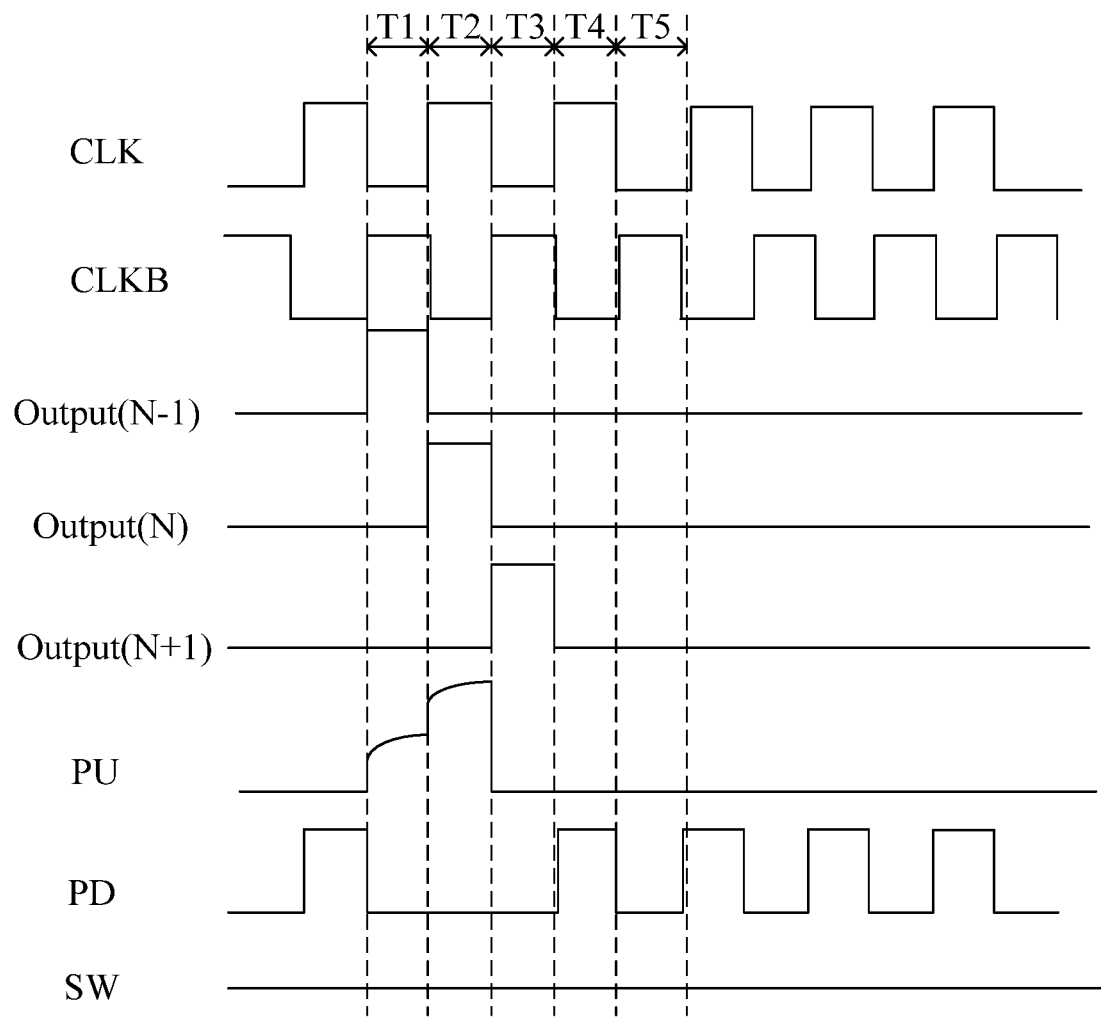
FIG. 5 is a timing diagram of a driving process of a shift register unit provided in an embodiment of the present disclosure.

FIG. 5 is a timing diagram of a driving process of a shift register unit provided in an embodiment of the present disclosure. As shown in FIG. 5, in a charging phase T1, the input signal input by the input signal terminal Input is an output signal Output(N−1) of a previous stage of shift register unit. Referring to FIG. 5, it can be known that in the charging phase T1, the output signal Output(N−1) of the previous stage of shift register unit is the first potential. Therefore, at this time, the first transistor M1 is turned on, the first power supply signal terminal VDD provides the first power supply signal to the pull-up node PU, the first power supply signal is the first potential, and the first potential is the high potential, so that charging of the pull-up node PU can be realized.

Since the pull-up node PU is the first potential, the seventh transistor M7 is turned on, and the third power supply signal terminal provides the third power supply signal to the pull-down node PD through the seventh transistor M7. Since the third power supply signal is the second potential, and the second potential is the low potential relative to the first potential, so that the fifth transistor M5, the sixth transistor M6 and the eighth transistor M8 are turned off, thereby guaranteeing stable output of signals.

In an output phase T2, the pull-up node PU maintains the first potential, and the third transistor M3, the seventh transistor M7 and the ninth transistor M9 are turned on. It can be seen from FIG. 5 that since the clock signal input by the clock signal terminal CLK is the first potential, the pull-up node PU amplifies the voltage of the pull-up node PU due to bootstrapping, and the third transistor M3 maintains in the turn-on state, so that the clock signal terminal CLK outputs the clock signal to the output terminal Output. The third power supply signal terminal VGL provides the third power supply signal to the pull-down node PD, and the switch power supply signal terminal SW provides the switch power supply signal to the gate of the tenth transistor M10. The third power supply signal is the second potential, and the fifth transistor M5, the sixth transistor M6 and the eighth transistor M8 are turned off. The switch power supply signal is the second potential, and the tenth transistor M10 and the fourth transistor M4 are turned off, thereby guaranteeing stable output of signals.

In a reset phase T3, the reset signal input by the reset signal terminal Reset is an output signal Output(N+1) of the next stage of shift register unit. It can be seen from FIG. 5 that the output signal Output(N+1) of the next stage of shift register unit in the reset phase T3 is the first potential. Therefore, at this time, the second transistor M2 is turned on, the second power supply signal terminal Vss provides the second power supply signal to the pull-up node PU, and the second power supply signal is the second potential, so that resetting of the pull-up node PU is realized. At this time, the third transistor M3, the seventh transistor M7 and the ninth transistor M9 are turned off. At this time, no driving signal is output from the output terminal Output.

Referring to FIG. 5, in a denoising phase T4, the clock signal input by the clock signal terminal CLK is the first potential, the second capacitor C2 pulls up the potential of the pull-down node PD to the first potential, and the sixth transistor M6, the fifth transistor M5 and the eighth transistor M8 are turned on. The third power supply signal terminal VGL provides the third power supply signal to the pull-up node PU, the output terminal Output and the gate of the tenth transistor M10 respectively, and the third power supply signal is the second potential, so that denoising of the pull-up node PU and the output terminal Output is realized, and the tenth transistor M10 is turned off. The denoising phase can make the shift register unit eliminate the coupling noise voltage produced by the clock signal terminal CLK in the non-operation state (i.e., non-output phase), so that low voltage output of the shift register unit is realized. At the same time, since the switch power supply signal input by the switch power supply terminal SW is the second potential in this phase, and the tenth transistor M10 is turned off, and would not charge the pull-up node, thereby guaranteeing the stability of signal output.

Optionally, returning to FIG. 3, when backward scanning is performed, the charging module 10 comprises: the second transistor M2; the reset module 20 comprises: the first transistor M1; the pull-up module 30 comprises: the third transistor M3, the first capacitor C1 and the second capacitor C2; the first pull-down module 40 comprises: the fourth transistor M4, the fifth transistor M5 and the sixth transistor M6; the second pull-down module 50 comprises: the seventh transistor M7; the compensation module 60 comprises: the eighth transistor M8, the ninth transistor M9 and the tenth transistor M10.

Referring to FIG. 5, in the charging phase T1, the input signal input by the input signal terminal Input is the first potential, the second transistor M 2 is turned on, the first power supply signal terminal VDD outputs the first power supply signal to the pull-up node PU, and the first power supply signal is the first potential.

In the output phase T2, the pull-up node PU maintains the first potential, the third transistor M3, the seventh transistor M7 and the ninth transistor M9 are turned on, and the clock signal input by the clock signal terminal CLK is transmitted to the output terminal Output through the third transistor M3, and the output terminal Output outputs the clock signal. The third power supply signal terminal VGL inputs the third power supply signal to the pull-down node PD, the switch power supply signal terminal SW provides the switch power supply signal to the gate of the tenth transistor M10. The third power supply signal is the second potential, the fifth transistor M5, the sixth transistor M6 and the eighth transistor M8 are turned off, the switch power supply signal is the second potential, and the tenth transistor M10 and the fourth transistor M4 are turned off.

In the reset phase T3, the reset signal input by the reset signal terminal Reset is the first potential, the first transistor M1 is turned on, the second power supply signal terminal Vss provides the second power supply signal to the pull-up node PU, and the second power supply signal is the second potential.

In the denoising phase T4, the clock signal input by the clock signal terminal CLK is the first potential, and the second capacitor C2 pulls up the potential of the pull-down node PD to the first potential. The sixth transistor M6, the fifth transistor M5 and the eighth transistor M8 are turned on. The third power supply signal terminal VGL, provides the third power supply signal to the pull-up node PU, the output terminal Output and the gate of the tenth transistor M10 respectively, the third power supply signal is the second potential, and the tenth transistor M10 is turned off.

It should be noted that the driving method of the shift register unit provided in the embodiment of the present disclosure can realize bilateral scanning of the shift register unit. Herein, when backward scanning is performed, the structure of the shift register does not change, and only functions of the input signal terminal and the reset signal terminal change, such that the functions of the first transistor M1 in the charging module and the second transistor M2 in the reset module exchange with each other. The principle of the backward scanning is the same as that of the forward scanning. Its specific implementation process can refer to the implementation process of the forward scanning. No repeated description is given thereto in the embodiment of the present disclosure.

Referring to FIG. 5, besides comprising the charging phase T1, the output phase T2, the reset phase T3 and the denoising phase T4, the driving process can further comprise the fifth phase T5. In the fifth phase T5, the clock signal input by the clock signal terminal CLK is the second potential, the seventh transistor M7 is turned off, the potential of the pull-down node PD is the second potential, and the sixth transistor M6 and the fifth transistor M5 are turned off. After the fifth phase T5 ends up, during the period that scanning of the previous frame ends up before the scanning of the next frame starts, the shift register unit can repeat the denoising phase T4, i.e., denoising the pull-up node and the output terminal constantly.

It should be noted that in FIG. 5, Output(N) is the signal output by the output terminal of the shift register unit in the respective embodiments, Output(N−1) is the signal output by the output terminal of the previous stage of shift register nit of the shift register unit, and Output(N+1) is the signal output by the output terminal of the next stage of shift register unit of the shift register unit.

Optionally, returning to FIG. 2, the first pull-down module 40 can comprise: the fourth transistor M4, the fifth transistor M5 and the sixth transistor M6.

In the vertical blanking phase, the switch power supply signal input by the switch power supply terminal SW is the first potential, the first potential is the high potential, the fourth transistor M4 is turned on, the third power supply signal terminal VGL provides the third power supply signal to the output terminal Output, the third power supply signal is the second potential, and the second potential is a low potential relative to the first potential.

In the embodiments of the present disclosure, the vertical blanking phase refers to an interval between the end of scanning of the previous frame of the shift register and the start of scanning of the next frame of the shift register. For an in cell display device, a touch control signal can be inserted into the vertical blanking phase. In the embodiments of the present disclosure, in the vertical blanking phase, the switch power supply signal input by the switch power supply terminal SW is the first potential. At this time, the fourth transistor M4 in the first pull-down module 40 is turned on, the third power supply signal terminal VGL provides the third power supply signal to the output terminal Output, and the third power supply signal is the second potential, so that denoising of the output terminal Output is realized. Therefore, denoising of the output terminal Output is performed between two frames, so that the driving signal is prevented from interfering with the touch control signal, and the display effect and the touch control effect of the display device are guaranteed. The vertical blanking phase can be compatible with a conventional gate driving mode and a vertical blanking gate driving mode of the in cell display device.

Optionally, returning to FIG. 2, the first pull-down module 40 can comprise: the fourth transistor M4, the fifth transistor M5 and the sixth transistor M6; the compensation module 60 can comprise: the eighth transistor M8, the ninth transistor M9 and the tenth transistor M10.

Figure 6:
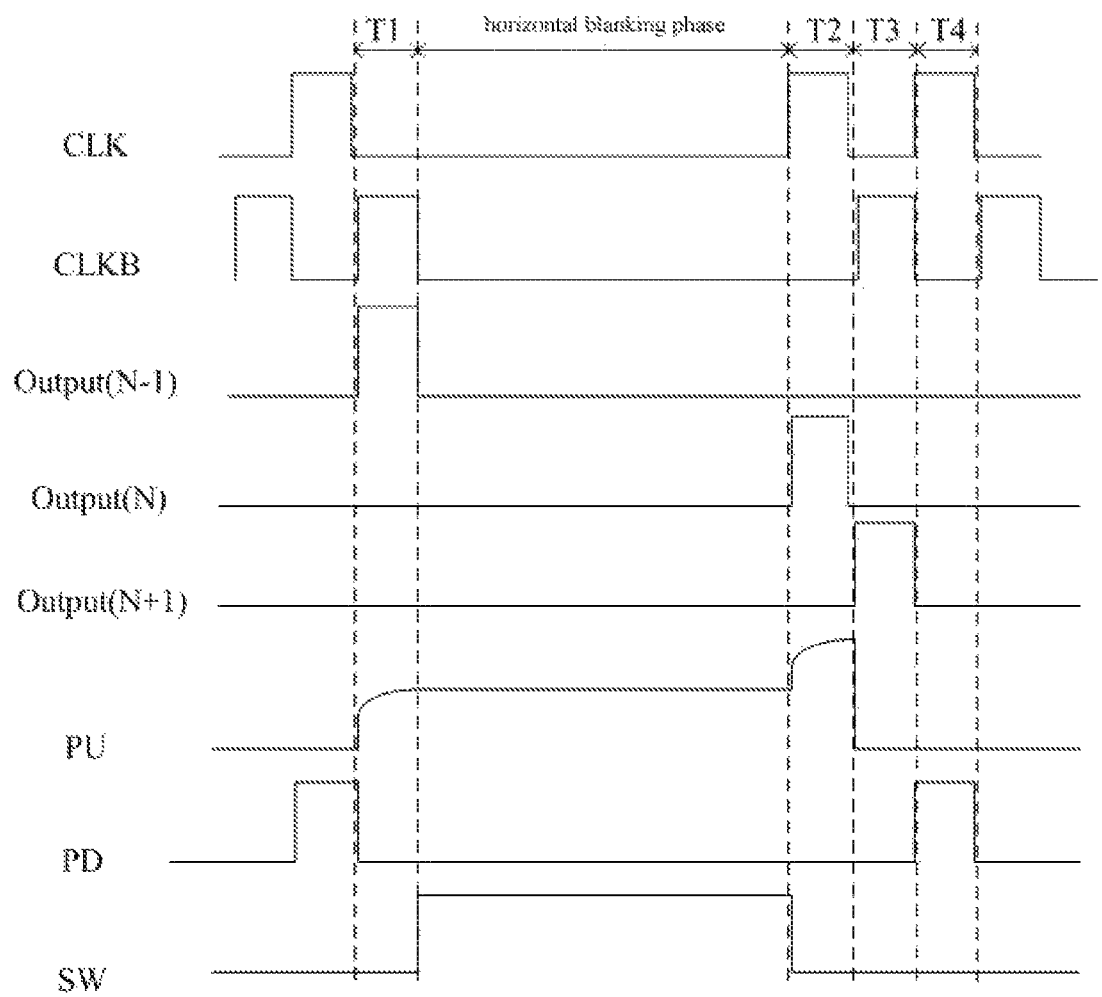
FIG. 6 is a timing diagram of a driving process of another shift register unit provided in an embodiment of the p resent disclosure.

FIG. 6 is a timing diagram of a driving process of the other shift register unit provided in an embodiment of the present disclosure. Referring to FIG. 6, in the horizontal blanking phase, the switch power supply signal input by the switch power supply terminal SW is the first potential. The pull-up node PU maintains the first potential, and the first potential is the high potential. At this time, the fourth transistor M4, the ninth transistor M9 and the tenth transistor M10 are turned on. The third power supply signal terminal VGL provides the third power supply signal to the output terminal Output, and the third power supply signal is the second potential. The second potential is a low potential relative to the first potential, and the switch power supply terminal SW provides the switch power supply signal to the pull-up node PU.

In the embodiments of the present disclosure, the horizontal blanking phase refers to an interval between the end of scanning of the previous row of the shift register and the start of scanning of the next row of the shift register. For an in cell display device, a touch control signal can be inserted into the horizontal blanking phase. In the embodiments of the present disclosure, in the horizontal blanking phase, the switch power supply signal input by the switch power supply terminal SW is the first potential. At this time, the fourth transistor M4 in the first pull-down module 40 is turned on, and the third power supply signal terminal VGL provides the third power supply signal to the output terminal Output. The third power supply signal is the second potential, so as to realize denoising of the output terminal Output, such that no driving signal is output by the output terminal Output, which prevents the driving signal of the shift register unit from interfering with the touch control signal, thereby raising the touch control effect of the display effect.

Further, as shown in FIG. 6, at this time, the pull-up node PU maintains the first potential, the ninth transistor M9 and the tenth transistor M10 are turned on, while the pull-down node PD is the second potential, and the eighth transistor M8 is turned off. At this time, the switch power supply terminal SW can charge the first capacitor C1 through the tenth transistor M10, such that the pull-up node PU maintains the first potential, which avoids from pulling down the potential of the pull-up node PU when leakage phenomenon occurs in the second transistor M2 or the sixth transistor M6 in the output phase T2. If the voltage of the pull-up node PU is too low, after the touch control phase ends up, it is possible to cause the problem of no output in the shift register unit or the output voltage being too low. Therefore, compensation for the potential of the pull-up node PU can be realized by charging the first capacitor C1 through the tenth transistor M10 (i.e., pulling up the potential of the pull-up node PU), which ensures that after the touch content phase ends up, the shift register can execute the output phase T2 continuously and normally. At the same time, in the output phase T2, since the pull-up node PU in the shift register units of other rows is at the second potential, no influence would be made on the subsequent driving process of the shift register unit of other rows.

After the touch control phase ends up, the switch power supply signal input by the switch power supply terminal SW is the second potential, and the shift register unit continuously executes the output phase T2. In the output phase T2, since the pull-down node PD in the shift register unit of other rows is the clock signal terminal CLK to carry out denoising process on the pull-up node PU and the output terminal Output, at this time, the eighth transistor M8 in the shift register unit of other rows is always in an alternate state of turn-on and turn-off, while the ninth transistor M9 and the tenth transistor M10 are always in the turn-off state. Therefore, the coupling effect of the switch power supply terminal SW on the pull-up node PU in the shift register unit of other rows can be reduced effectively, the problem of influencing the display of other rows because the switch power supply terminal SW pulls up the potential of the pull-up node PU is avoided, and the display effect of the display device is raised. The horizontal blanking phase can be compatible with the horizontal blanking gate driving mode of the in cell display device.

It should be noted that the first to tenth transistors in respective embodiments of the present disclosure can be N type transistors. The first potential is the high potential relative to the second potential.

To sum up, there is provided in the embodiment of the present disclosure a driving method of a shift register unit. The driving method mainly comprises the charging phase, the output phase, the reset phase and the denoising phase. In the denoising phase, the first pull-down module is capable of denoising the pull-up node and the output terminal respectively under the control of the pull-down node, the third power supply signal from the third power supply signal terminal and the switch power supply signal from the switch power supply signal. Therefore, the noises of the pull-up node and the output terminal in the shift register unit are reduced, and the output effect of the shift register unit is improved. Furthermore, the driving method of the shift register unit provided in the embodiment of the present disclosure can be compatible with the conventional gate driving mode, the vertical blanking gate driving mode and horizontal blanking gate driving mode of the in cell display device, and its driving method is highly flexibly.

It should be noted that the above embodiments are described by taking the first to tenth transistors being N type transistors, the first potential being the high potential and the second potential being the low potential as an example. Of course, the first to tenth transistors can also adopt the P type transistors. When the first to tenth transistors adopt the P type transistors, the first potential is the low potential, and the second potential is the high potential. Furthermore, potential variation of the clock signal terminal CLK, the second clock signal terminal CLKB and the switch power supply terminal SW can be reverse to the potential variation as shown in FIGS. 5 and 6 (that is, a phase difference of the potentials of the second clock signal terminal CLKB and the switch power supply terminal SW is 180 degrees).

Figure 7:
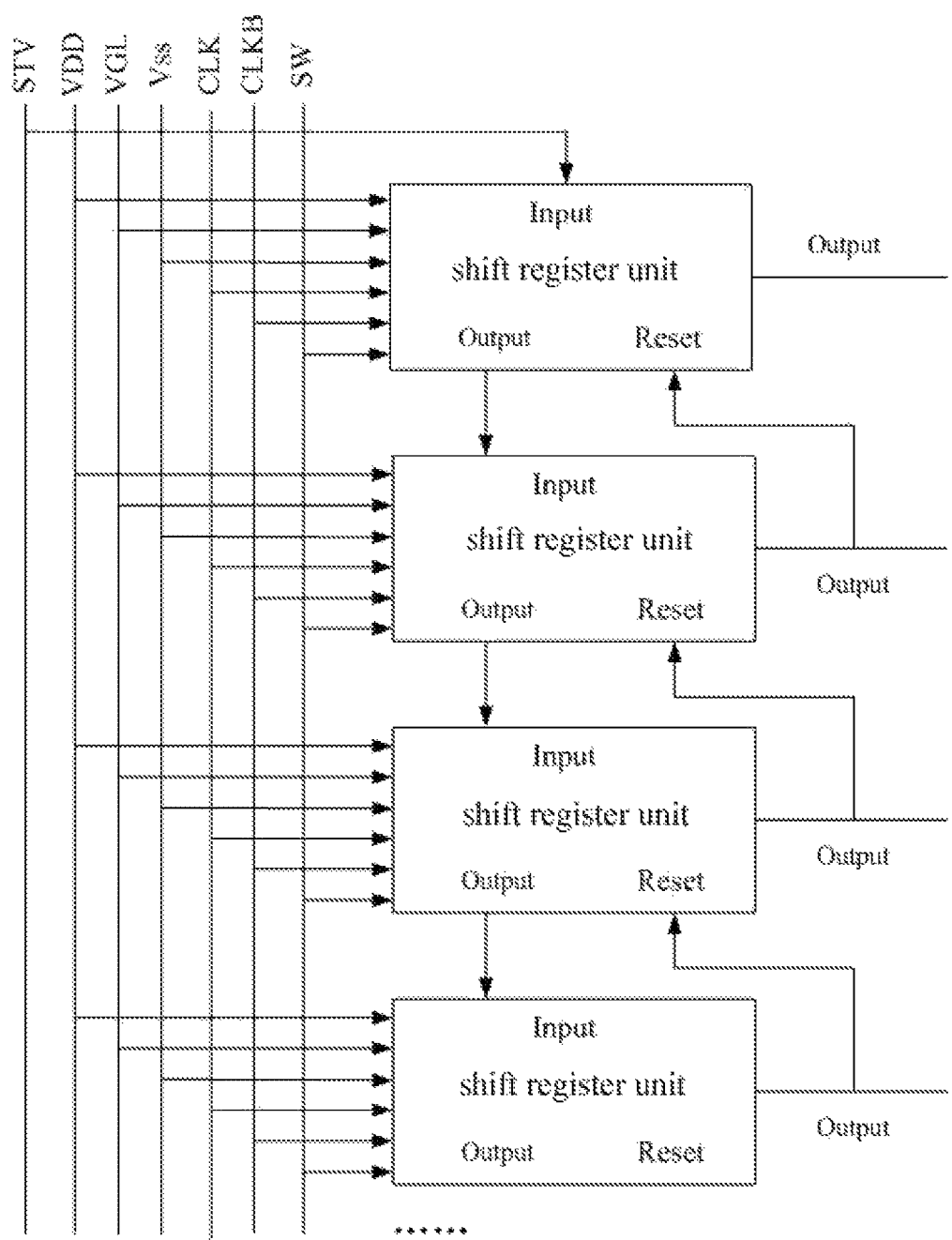
FIG. 7 is a structure schematic diagram of a gate driving circuit provided in an embodiment of the present disclosure.

FIG. 7 is a structure schematic diagram of a gate driving circuit provided in an embodiment of the present disclosure. As shown in FIG. 7, the gate driving circuit can comprising at least two shift register units connected in cascades, wherein each shift register unit can be the shift register nit as shown in FIG. 1, FIG. 2 or FIG. 3.

Additionally, there is further provided in an embodiment of the present disclosure a display device. The display device can comprise the gate driving circuit as shown in FIG. 7. The display device can be any product or components having the function of displaying such as a liquid crystal panel, an electronic paper, an OLED panel, an AMOLED panel, a mobile phone, a panel computer, a television set, a display, a notebook computer, a digital photo frame, and a navigator or the like.

The above descriptions are just exemplary embodiments of the present disclosure, and are not used to limit the protection scope of the present disclosure. Any amendment, equivalent replacement, improvement made within the principle of the present disclosure shall be covered within the protection scope defined in the Claims of the present disclosure.

What is claimed is:
1. A shift register unit, comprising:
   a charging module, connected to a first power supply signal terminal, an input signal terminal and a pull-up node, and configured to charge the pull-up node under the control of an input signal from the input signal terminal;
   a reset module, connected to a second power supply signal terminal, a reset signal terminal and the pull-up node, and configured to reset the pull-up node under the control of a reset signal from the reset signal terminal;

a pull-up module, connected to a clock signal terminal, the pull-up node, a pull-down node and an output terminal, and configured to output a driving signal to the output terminal under the control of the pull-up node and the pull-down node;

a first pull-down module, connected to the pull-down node, the pull-up node, a third power supply signal terminal, a switch power supply terminal and the output terminal, and configured to denoise the pull-up node and the output terminal respectively under the control of the pull-down node and a switch power supply signal from the switch power supply terminal;

a second pull-down module, connected to the pull-up node, the pull-down node and the third power supply signal terminal, and configured to pull down a potential of the pull-down node under the control of the pull-up node; and a compensation module, connected to the pull-up node, the pull-down node, the third power supply signal terminal and the switch power supply terminal, and configured to compensate for a potential of the pull-up node under the control of the pull-down node and the switch power supply signal from the switch power supply terminal, wherein the second pull-down module comprises a seventh transistor, a first electrode of the seventh transistor is connected to the third power supply signal terminal, a second electrode of the seventh transistor is connected to the pull-down node, and a gate of the seventh transistor is connected to the pull-up node.

2. The shift register unit according to claim 1, wherein when forward scanning is performed, the charging module comprises a first transistor;
the reset module comprises a second transistor;
a first electrode of the first transistor is connected to the first power supply signal terminal, a second electrode of the first transistor is connected to the pull-up node, and a gate of the first transistor is connected to the input signal terminal; and a first electrode of the second transistor is connected to the second power supply signal terminal, a second electrode of the second transistor is connected to the pull-up node, and a gate of the second transistor is connected to the reset signal terminal.

3. The shift register unit according to claim 1, wherein when backward scanning is performed, the charging module comprises a second transistor;
the reset module comprises a first transistor;
the first electrode of the second transistor is connected to the first power supply signal terminal, the second electrode of the second transistor is connected to the pull-up node, and the gate of the second transistor is connected to the input signal terminal; and the first electrode of the first transistor is connected to the second power supply signal terminal, the second electrode of the first transistor is connected to the pull-up node, and the gate of the first transistor is connected to the reset signal terminal.

4. The shift register unit according to claim 1, wherein the pull-up module comprises a third transistor, a first capacitor and a second capacitor;

a first electrode of the third transistor is connected to the clock signal terminal, a second electrode of the third transistor is connected to the output terminal, and a gate of the third transistor is connected to the pull-up node;

one terminal of the first capacitor is connected to the pull-up node, and the other terminal of the first capacitor is connected to the output terminal; and one terminal of the second capacitor is connected to the clock signal terminal, and the other terminal of the second capacitor is connected to the pull-down node.

5. The shift register unit according to claim 1, wherein the first pull-down module comprises a fourth transistor, a fifth transistor and a sixth transistor;

a first electrode of the fourth transistor is connected to the third power supply signal terminal, a second electrode of the fourth transistor is connected to the output terminal, and a gate of the fourth transistor is connected to the switch power supply terminal;

a first electrode of the fifth transistor is connected to the third power supply signal terminal, a second electrode of the fifth transistor is connected to the output terminal, and a gate of the fifth transistor is connected to the pull-down node; and a first electrode of the sixth transistor is connected to the third power supply signal terminal, a second electrode of the sixth transistor is connected to the pull-up node, and a gate of the sixth transistor is connected to the pull-down node.

6. The shift register unit according to claim 1, wherein the compensation module comprises an eighth transistor, a ninth transistor and a tenth transistor;

a first electrode of the eighth transistor is connected to the third power supply signal terminal, a second electrode of the eighth transistor is connected to a gate of the tenth transistor, and a gate of the eighth transistor is connected to the pull-down node;

a first electrode of the ninth transistor is connected to the switch power supply terminal, a second electrode of the ninth transistor is connected to the gate of the tenth transistor, and a gate of the ninth transistor is connected to the pull-up node; and a first electrode of the tenth transistor is connected to the switch power supply terminal, a second electrode of the tenth transistor is connected to the pull-up node, and the gate of the tenth transistor is connected to the second electrode of the eighth transistor and the second electrode of the ninth transistor.

7. The shift register unit according to claim 2, wherein the transistors are N type transistors.

8. A driving method of a shift register unit which comprises: a charging module, a reset module, a pull-up module, a first pull-down module, a second pull-down module and a compensation module, the driving method comprising:

in a charging phase, inputting a first power supply signal via a first power supply signal terminal, inputting an input signal via an input signal terminal, inputting a clock signal via a clock signal terminal, and outputting the first power supply signal to a pull-up node by the charging module under the control of the input signal;

in an output phase, inputting a switch power supply signal via a switch power supply terminal, inputting the input signal via the input signal terminal, inputting the clock signal via the clock signal terminal, making the pull-up node maintain a potential of the first power supply signal, and outputting the clock signal to the output terminal by the pull-up module under the control of the pull-up node;

in a reset phase, inputting a reset signal via a reset signal terminal, inputting a second power supply signal via a second power supply signal terminal, and outputting the second power supply signal to the pull-up node by the reset module under the control of the reset signal; and in a denoising phase, inputting a third power supply signal via a third power supply signal terminal, inputting the clock signal via the clock signal terminal, making the pull-up node maintain a potential of the second power supply signal, pulling up a potential of the pull-down node by the pull-up module under the control of the clock signal, and outputting the third power supply signal to the pull-up node and the output terminal respectively by the first pull-down module under the control of the pull-down node, wherein the second pull-down module comprises a seventh transistor, a first electrode of the seventh transistor is connected to the third power supply signal terminal, a second electrode of the seventh transistor is connected to the pull-down node, and a gate of the seventh transistor is connected to the pull-up node.

9. The method according to claim 8, when a touch control signal is received, after the denoising phase, the method further comprises:

in a vertical blanking phase: the switch power supply signal input by the switch power supply terminal being a first potential, outputting the third power supply signal to the output terminal by the first pull-down module under the control of the switch power supply signal, and the third power supply signal being a second potential.

10. The method according to claim 8, wherein when a touch control signal is received, between the output phase and the reset phase, the method further comprises:

in a horizontal blanking phase: the switch power supply signal input by the switch power supply terminal being the first potential, outputting the third power supply signal to the output terminal by the first pull-down module under the control of the switch power supply signal, the third power supply signal being the second potential, making the pull-up node maintain the first potential, and outputting the switch power supply signal to the pull-up node by the compensation module under the control of the pull-up node.

11. The method according to claim 9, wherein the first potential is a high potential relative to the second potential.

12. A gate driving circuit, comprising at least two shift register units according to claim 1 connected in cascades.

13. A display device, comprising the gate driving circuit according to claim 12.

14. The gate driving circuit according to claim 12, wherein when forward scanning is performed, the charging module comprises a first transistor;
the reset module comprises a second transistor;
a first electrode of the first transistor is connected to the first power supply signal terminal, a second electrode of the first transistor is connected to the pull-up node, and a gate of the first transistor is connected to the input signal terminal; and
a first electrode of the second transistor is connected to the second power supply signal terminal, a second electrode of the second transistor is connected to the pull-up node, and a gate of the second transistor is connected to the reset signal terminal.

15. The gate driving circuit according to claim 12, wherein when backward scanning is performed, the charging module comprises a second transistor;
the reset module comprises a first transistor;
the first electrode of the second transistor is connected to the first power supply signal terminal, the second electrode of the second transistor is connected to the pull-up node, and the gate of the second transistor is connected to the input signal terminal; and
the first electrode of the first transistor is connected to the second power supply signal terminal, the second electrode of the first transistor is connected to the pull-up node, and the gate of the first transistor is connected to the reset signal terminal.

16. The gate driving circuit according to claim 12, wherein the pull-up module comprises a third transistor, a first capacitor and a second capacitor;

a first electrode of the third transistor is connected to the clock signal terminal, a second electrode of the third transistor is connected to the output terminal, and a gate of the third transistor is connected to the pull-up node;
one terminal of the first capacitor is connected to the pull-up node, and the other terminal of the first capacitor is connected to the output terminal; and
one terminal of the second capacitor is connected to the clock signal terminal, and the other terminal of the second capacitor is connected to the pull-down node.

17. The gate driving circuit according to claim 12, wherein the first pull-down module comprises a fourth transistor, a fifth transistor and a sixth transistor;

a first electrode of the fourth transistor is connected to the third power supply signal terminal, a second electrode of the fourth transistor is connected to the output terminal, and a gate of the fourth transistor is connected to the switch power supply terminal;
a first electrode of the fifth transistor is connected to the third power supply signal terminal, a second electrode of the fifth transistor is connected to the output terminal, and a gate of the fifth transistor is connected to the pull-down node; and
a first electrode of the sixth transistor is connected to the third power supply signal terminal, a second electrode of the sixth transistor is connected to the pull-up node, and a gate of the sixth transistor is connected to the pull-down node.

18. The gate driving circuit according to claim 12, wherein the compensation module comprises an eighth transistor, a ninth transistor and a tenth transistor;

a first electrode of the eighth transistor is connected to the third power supply signal terminal, a second electrode of the eighth transistor is connected to a gate of the tenth transistor, and a gate of the eighth transistor is connected to the pull-down node;
a first electrode of the ninth transistor is connected to the switch power supply terminal, a second electrode of the ninth transistor is connected to the gate of the tenth transistor, and a gate of the ninth transistor is connected to the pull-up node; and
a first electrode of the tenth transistor is connected to the switch power supply terminal, a second electrode of the tenth transistor is connected to the pull-up node, and the gate of the tenth transistor is connected to the second electrode of the eighth transistor and the second electrode of the ninth transistor.

* * * * *